US012619167B2

(12) United States Patent
Chan et al.

(10) Patent No.: US 12,619,167 B2
(45) Date of Patent: *May 5, 2026

(54) OPTICAL INSPECTION DEVICE FOR SURFACE OF RETICLE POD AND OPTICAL INSPECTION METHOD FOR SURFACE OF RETICLE POD

(71) Applicant: GUDENG EQUIPMENT CO., LTD., New Taipei City (TW)

(72) Inventors: Yin-Feng Chan, New Taipei City (TW); Lin-Hsin Tu, New Taipei City (TW); Ming-Mo Lo, New Taipei City (TW)

(73) Assignee: GUDENG EQUIPMENT CO., LTD., New Taipei City (TW)

( * ) Notice: Subject to any disclaimer, the term of this patent is extended or adjusted under 35 U.S.C. 154(b) by 305 days.

This patent is subject to a terminal disclaimer.

(21) Appl. No.: 18/319,510

(22) Filed: May 18, 2023

(65) Prior Publication Data

US 2024/0295830 A1      Sep. 5, 2024

(30) Foreign Application Priority Data

Mar. 3, 2023   (TW) ................................. 112107864

(51) Int. Cl.
*G03F 7/00* (2006.01)
*G03F 1/66* (2012.01)
*G03F 1/84* (2012.01)

(52) U.S. Cl.
CPC ............ *G03F 7/70741* (2013.01); *G03F 1/66* (2013.01); *G03F 1/84* (2013.01)

(58) Field of Classification Search
CPC ........... G03F 1/66; G03F 1/84; G03F 7/70741
See application file for complete search history.

(56) References Cited

U.S. PATENT DOCUMENTS

2003/0013026 A1* 1/2003 Lim ...................... G03F 7/7075
                                                              430/30
2014/0294238 A1* 10/2014 Kolb ...................... G01N 33/14
                                                              382/103

(Continued)

FOREIGN PATENT DOCUMENTS

JP        2015178357 A  * 10/2015
WO     WO-2022176288 A1 * 8/2022   ........... B65G 1/0457

OTHER PUBLICATIONS

Dahl, Nydal Oyvind, "A Guide to How A Relay Works", Nov. 20, 2012.*

*Primary Examiner* — Peter B Kim

(57) ABSTRACT

An optical inspection device for a surface of a reticle pod includes a carrier platform having a carrier surface, a light source module, a photographic module, and a control module. The light source module includes first and second light sources for irradiating the carrier surface in first and second directions, respectively. An angle of an included angle between the first direction and the carrier surface is greater than an angle of an included angle between the second direction and the carrier surface. The control module is signally connected to the camera module, first light source, and second light source. The control module controls one of the first light source and second light source to turn on and the other one to turn off. An optical inspection method for a surface of a reticle pod is further provided to operate to inspect a reticle pod efficiently and precisely.

4 Claims, 13 Drawing Sheets

(56)    References Cited

U.S. PATENT DOCUMENTS

| | | | |
|---|---|---|---|
| 2024/0128113 A1* | 4/2024 | Shimizu | H01L 21/67259 |
| 2024/0295461 A1* | 9/2024 | Chan | H04N 23/56 |
| 2024/0295504 A1* | 9/2024 | Chan | G01N 21/94 |

* cited by examiner

100

141

14

1

5

100

200

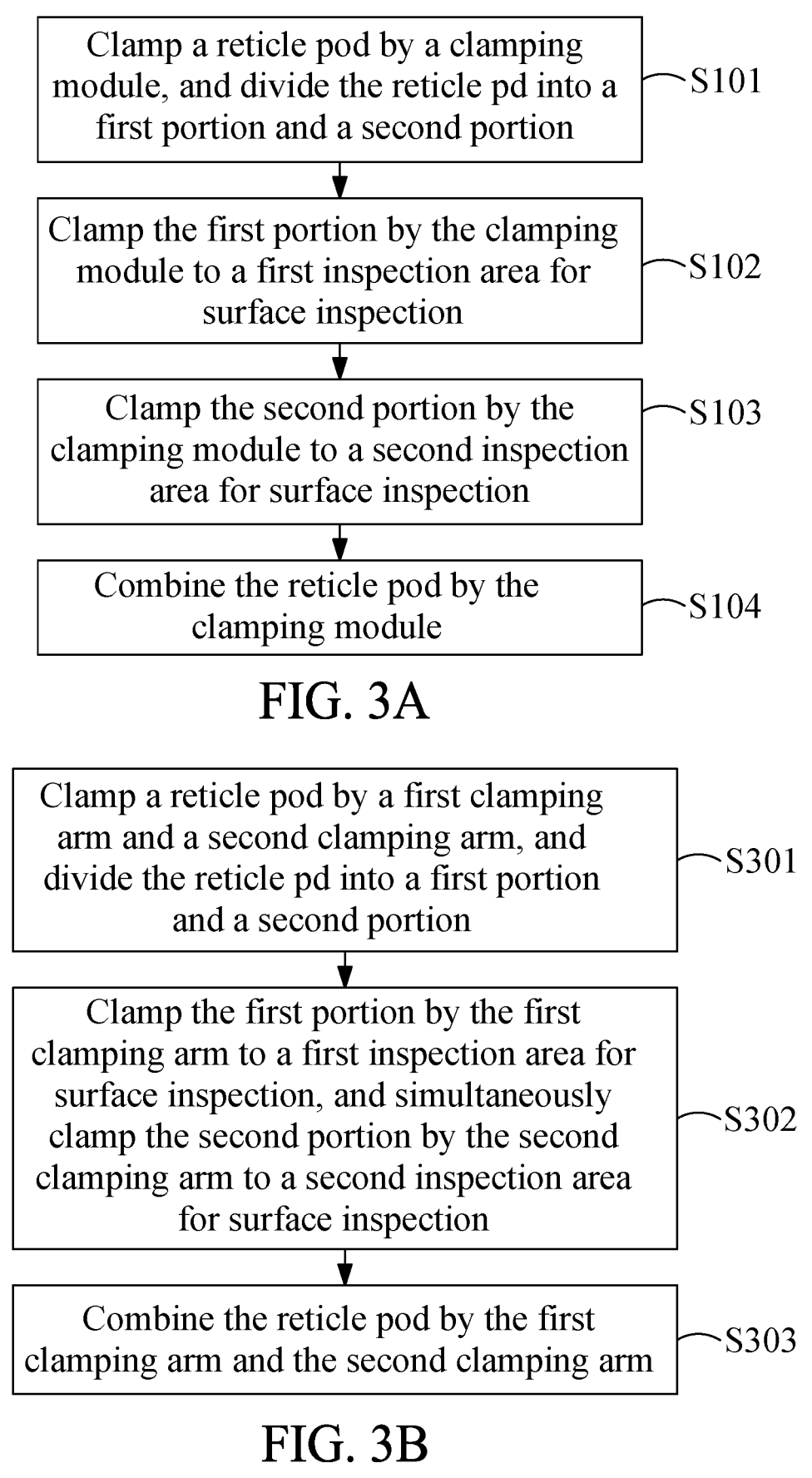

Clamp a reticle pod by a clamping module, and divide the reticle pd into a first portion and a second portion ⌐~S101

↓

Clamp the first portion by the clamping module to a first inspection area for surface inspection ⌐~S102

↓

Clamp the second portion by the clamping module to a second inspection area for surface inspection ⌐~S103

↓

Combine the reticle pod by the clamping module ⌐~S104

FIG. 3A

Clamp a reticle pod by a first clamping arm and a second clamping arm, and divide the reticle pd into a first portion and a second portion ⌐~S301

↓

Clamp the first portion by the first clamping arm to a first inspection area for surface inspection, and simultaneously clamp the second portion by the second clamping arm to a second inspection area for surface inspection ⌐~S302

↓

Combine the reticle pod by the first clamping arm and the second clamping arm ⌐~S303

FIG. 3B

OPTICAL INSPECTION DEVICE FOR SURFACE OF RETICLE POD AND OPTICAL INSPECTION METHOD FOR SURFACE OF RETICLE POD

CROSS-REFERENCE TO RELATED APPLICATION

This non-provisional application claims priority under 35 U.S.C. § 119 (a) on Patent Application No(s). 112107864 filed in Taiwan, R.O.C. on Mar. 3, 2023, the entire contents of which are hereby incorporated by reference.

BACKGROUND OF THE INVENTION

1. Field of the Invention

The present application relates to inspection devices and inspection methods, and in particular to an optical inspection device for a surface of a reticle pod and an optical inspection method for a surface of a reticle pod.

2. Description of the Related Art

In advanced lithography processes in the field of semiconductors, and more particularly for the extreme ultraviolet light (EUV) lithography process, an extremely high level of cleanliness of the process environment is required. In case of contamination of a reticle by particles, defects in the lithography process can result. To meet requirements of cleanliness and reticle protection, a reticle pod is generally used to block external particles. Thus, the cleanliness and lack of existence of defects (such as scratches) of a reticle pod are critical.

However, the industry yet lacks an inspection apparatus capable of efficiently and accurately inspecting a reticle pod. In addition, unlike wafer or reticles having only one single plane to be inspected, a reticle pod has multiple high and low planes as well as respective obverse and reverse sides of upper and lower covers that need to be inspected. Therefore, how to inspect surface of the reticle pod quickly and accurately is an important issue.

BRIEF SUMMARY OF THE INVENTION

To overcome various issues of surface inspection for a reticle pod of the prior art, the present application provides an optical inspection device for a surface of a reticle pod and an optical inspection method for a surface of a reticle pod.

To achieve the above and other objectives, an optical inspection device for a surface of a reticle pod provided in the application comprises: a carrier platform having a carrier surface; a light source module including a first light source and a second light source, wherein the first light source irradiates the carrier surface in a first direction, the second light source irradiates the carrier surface in a second direction, an angle of an included angle between the first direction and the carrier surface is greater than an angle of an included angle between the second direction and the carrier surface; a camera module, wherein a lens of the camera module faces the carrier surface; and a control module signally connected to the camera module, the first light source, and the second light source, the control module controls one of the first light source and the second light source to be turned on and the other to be turned off.

In an embodiment of the application, the optical inspection device for a surface of a reticle pod further comprises a power module signally connected to the control module.

In an embodiment of the application, the power module is power connected to the carrier platform, and the control module controls the carrier platform to move relative to the camera module.

In an embodiment of the application, the power module is power connected to the camera module, and the control module controls the camera module to move relative to the carrier platform.

In an embodiment of the application, the first light source is an external coaxial light source, and the second light source is a side light source.

In an embodiment of the application, the first light source is an internal coaxial light source, and the second light source is a side light source.

In an embodiment of the application, the optical inspection device for a surface of a reticle pod further comprises a switch, being signally connected to the control module, the first light source, and the second light source.

The application further provides an optical inspection method for a surface of a reticle pod, comprising the steps of: irradiating a component of a reticle pod by a first light source in a first direction; capturing a partial surface of the component of the reticle pod to obtain a first image; irradiating the component of the reticle pod by a second light source in a second direction, wherein an angle of an included angle between the first direction and a carrier surface is greater than an angle of an included angle between the second direction and the carrier surface; capturing the partial surface of the component of the reticle pod to obtain a second image; and determining whether a defect exists according to the first image and the second image.

In an embodiment of the application, the optical inspection method for a surface of a reticle pod further comprises the step: switching between the first light source and the second light source with a switch.

In an embodiment of the application, the optical inspection method for a surface of a reticle pod further comprises the step: moving the component of the reticle pod and the camera module relatively to obtain an image of another part of the surface of the reticle pod.

Therefore, according to the application, the optical inspection device for a surface of a reticle pod and the optical inspection method for a surface of a reticle pod are effective in quickly and precisely inspecting reticle pod surfaces to evaluate their cleanness and defects.

3

Figure 2A:
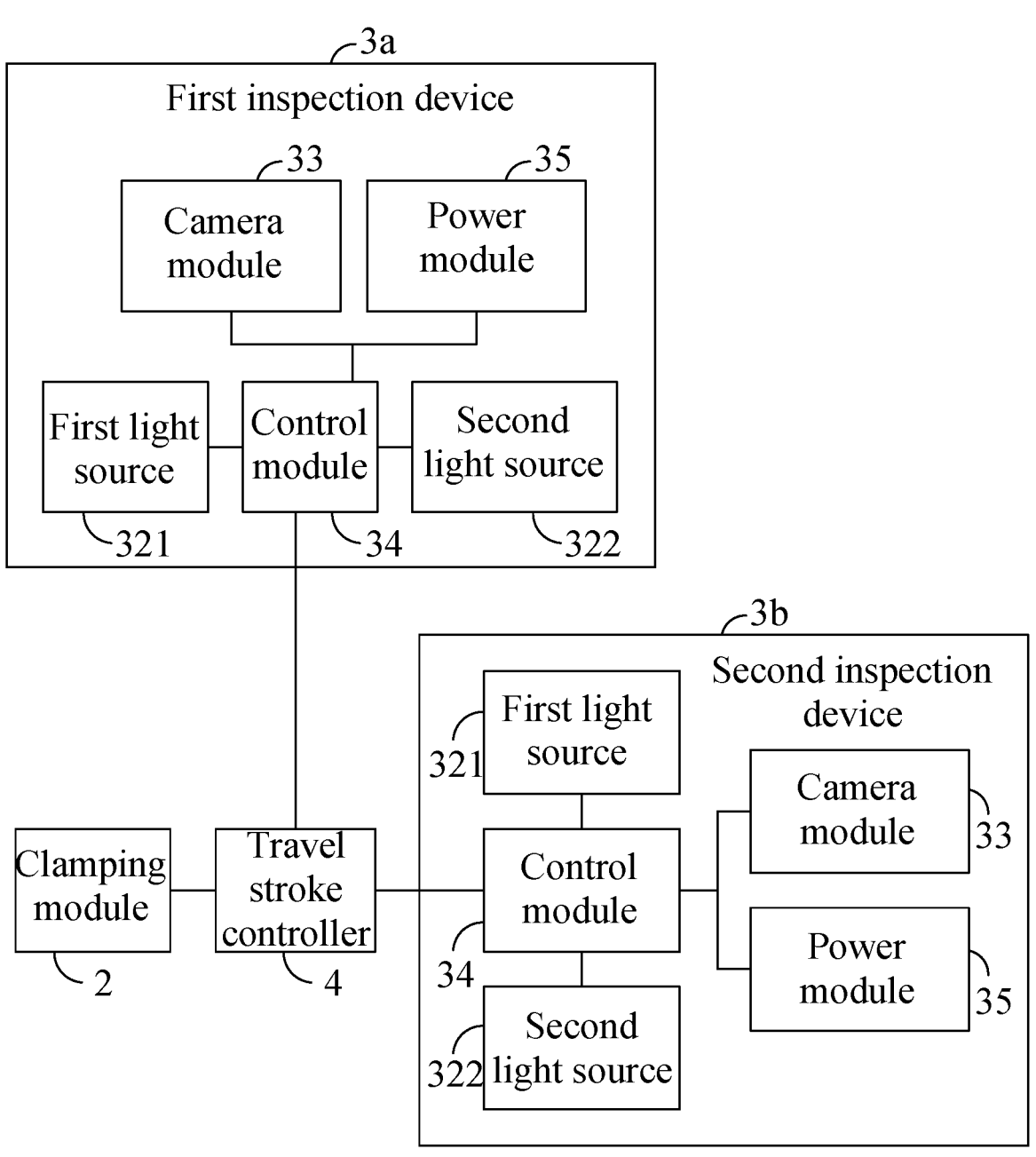
FIG. 2A is a block diagram of a high-speed surface inspection system for a reticle pod according to the first embodiment of the present application.
Figure 2B:
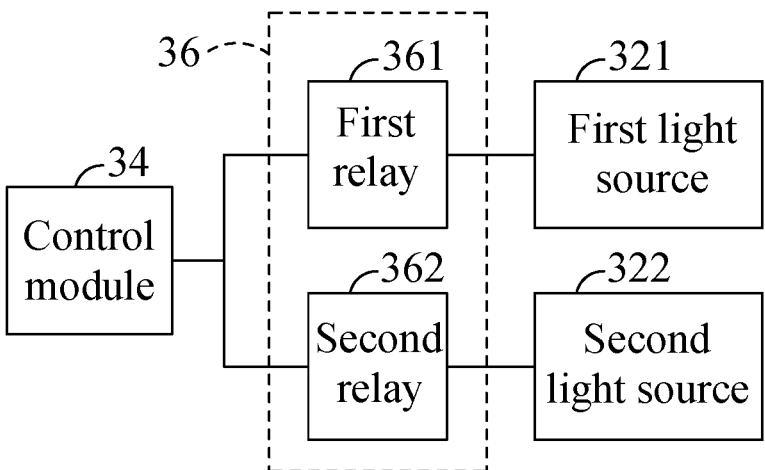

FIG. 2B is a schematic diagram of connections of a first relay and second relay according to an embodiment of the present application.

Figure 2C:
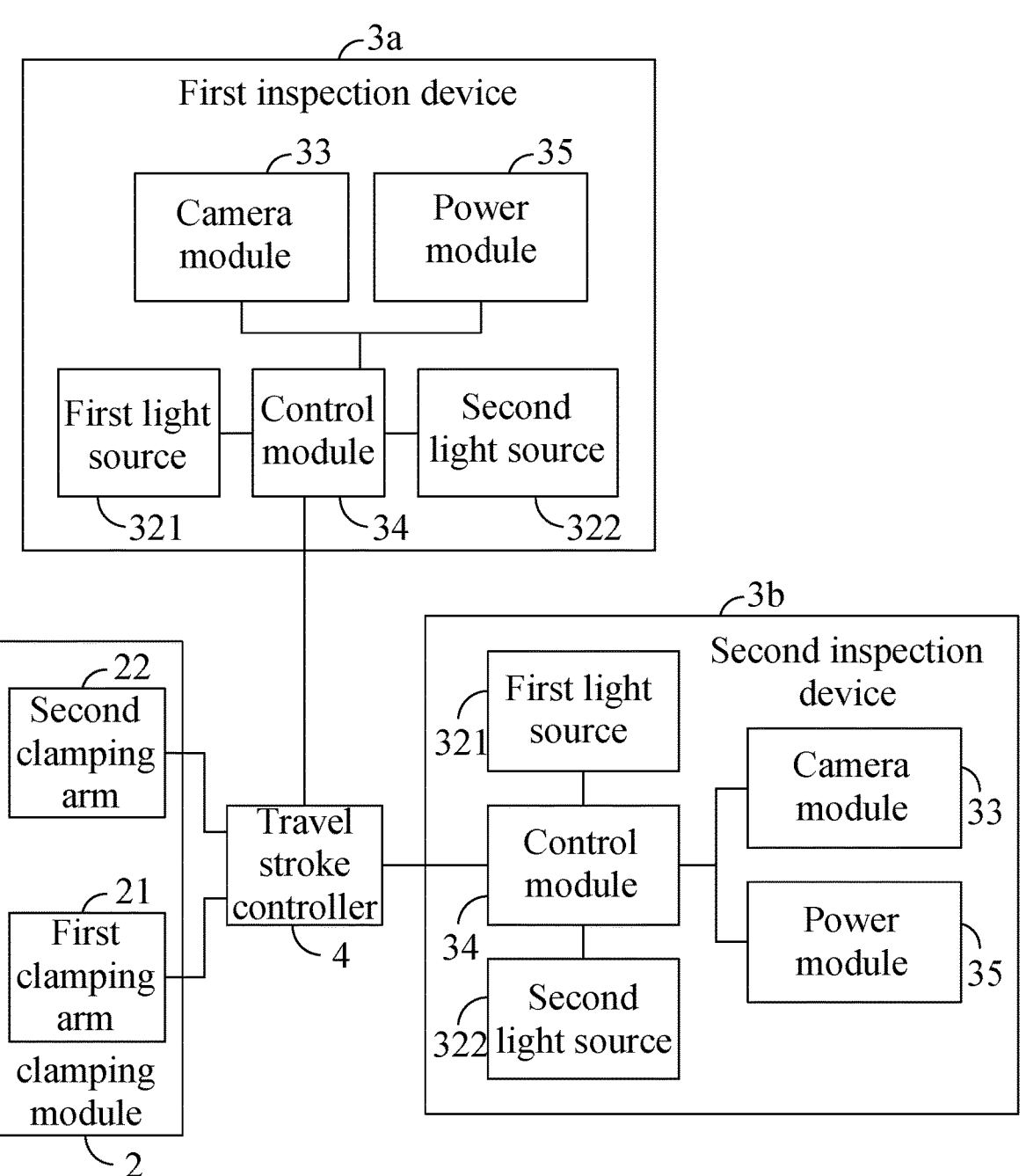

FIG. 2C is a block diagram of a high-speed surface inspection system for a reticle pod according to the second embodiment of the present application.

FIG. 3A is a flowchart of a high-speed surface inspection method for a reticle pod according to the first embodiment of the present application.

FIG. 3B is a flowchart of a high-speed surface inspection method for a reticle pod according to the second embodiment of the present application.

Figure 4A:
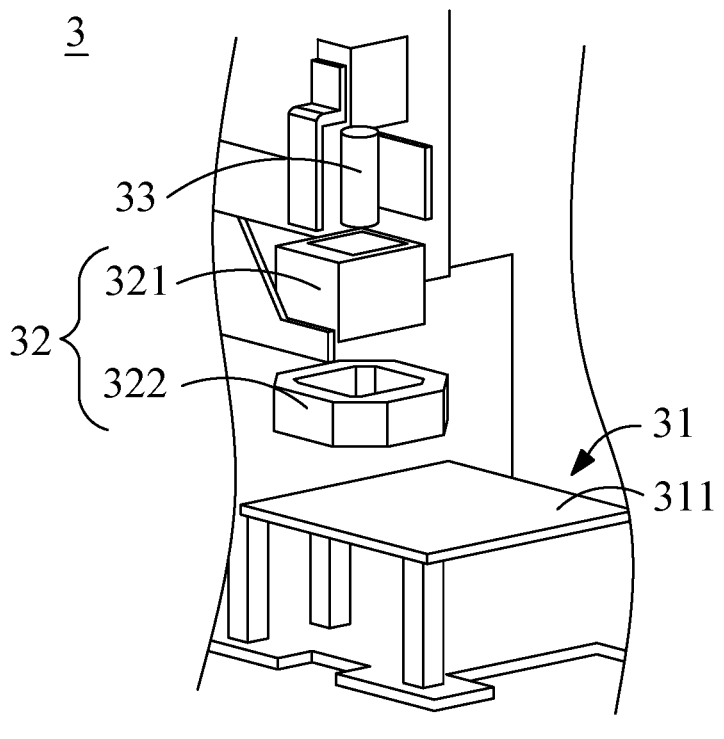

FIG. 4A is a perspective schematic diagram of an optical inspection device for a surface of a reticle pod using an external coaxial light source according to an embodiment of the present application.

Figures 4B, 4C:
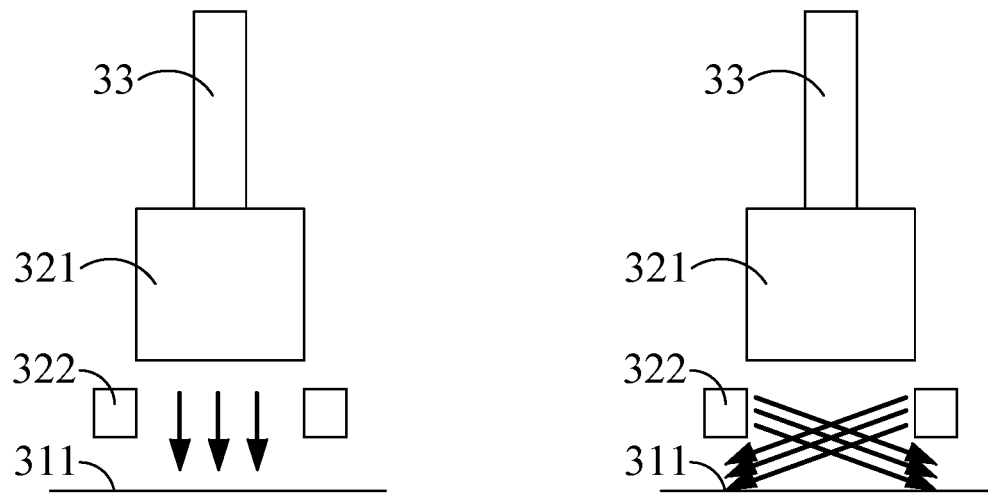

FIG. 4B is a schematic diagram of an external coaxial light source according to an embodiment of the present application.

FIG. 4C is a schematic diagram of a side light source according to an embodiment of the present application.

Figure 5:
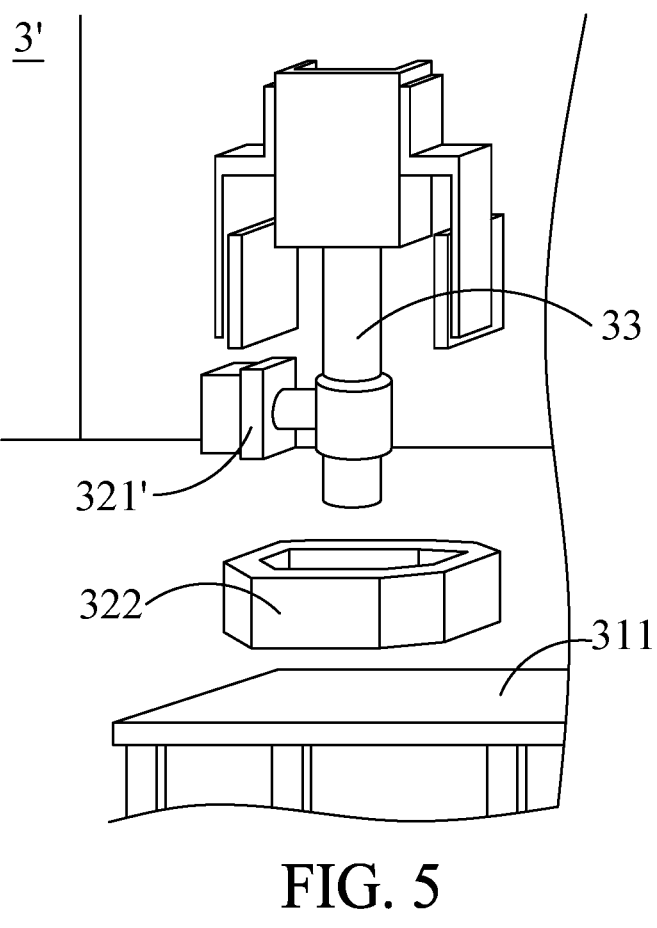

FIG. 5 is a perspective schematic diagram of an optical inspection device for a surface of a reticle pod using an internal coaxial light source according to an embodiment of the present application.

Figure 6:
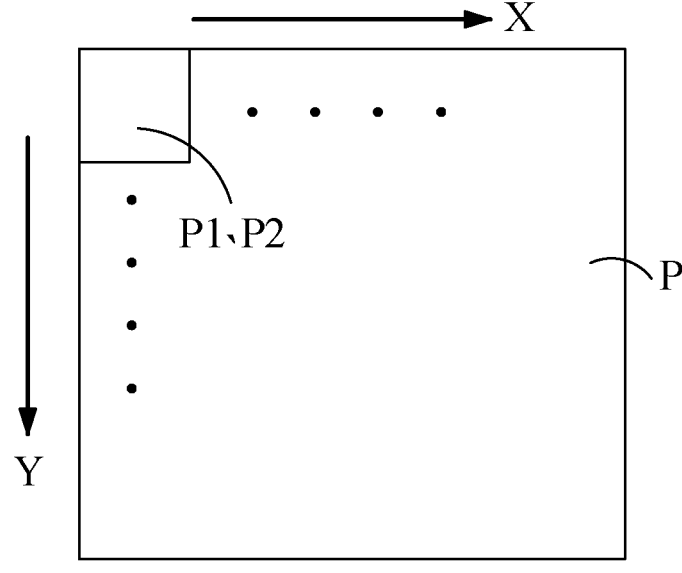

FIG. 6 is a schematic diagram of moving and capturing an image of a reticle pod in an optical inspection method for a surface of a reticle pod according to an embodiment of the present application.

Figure 7:
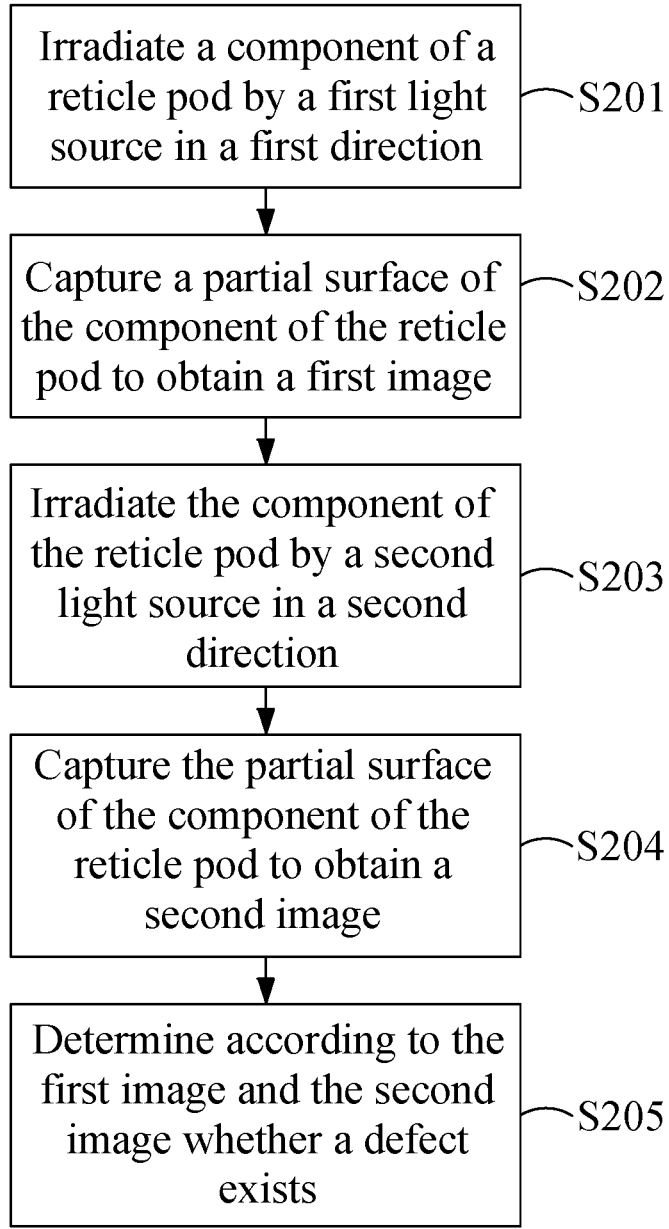

FIG. 7 is a flowchart of an optical inspection method for a surface of a reticle pod according to an embodiment of the present application.

Figure 8A:
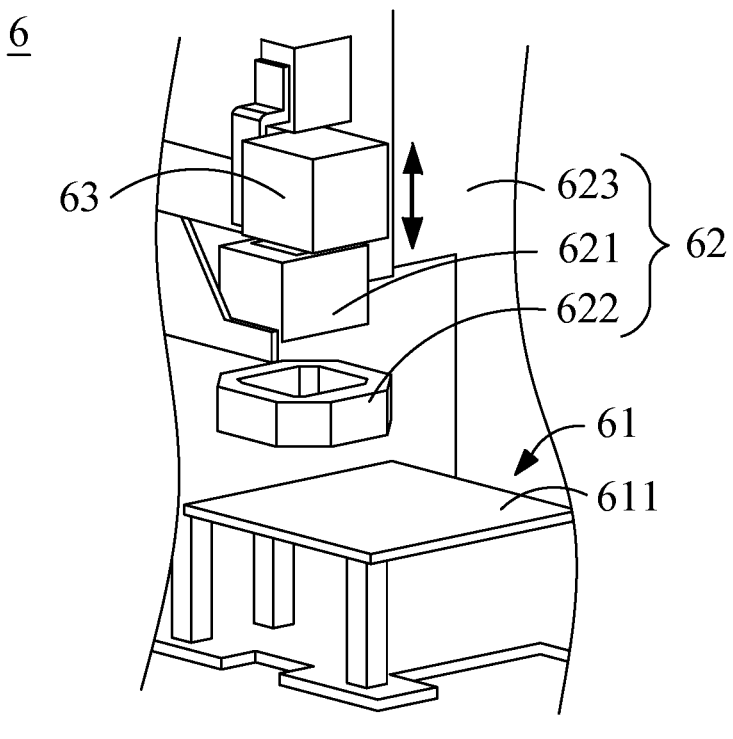

FIG. 8A is a perspective schematic diagram of an inspection device for a sub-element of a reticle pod according to an embodiment of the present application.

Figure 8B:
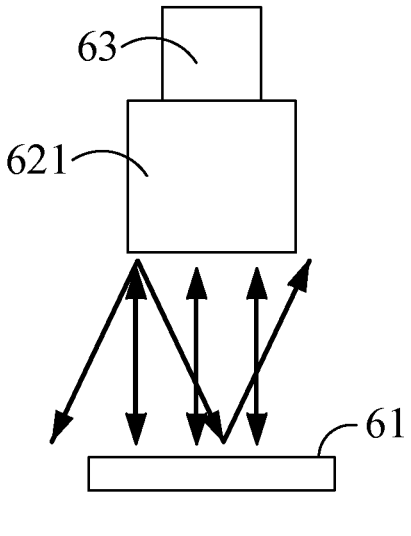

FIG. 8B is a schematic diagram of a high coaxial light according to an embodiment of the present application.

Figure 8C:
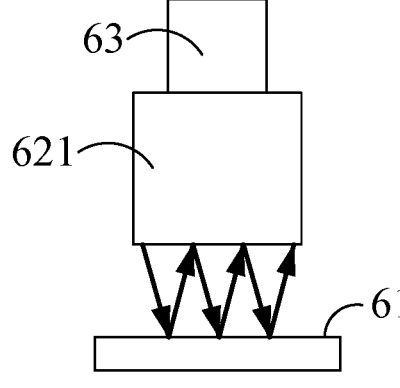

FIG. 8C is a schematic diagram of a low coaxial light according to an embodiment of the present application.

Figure 9:
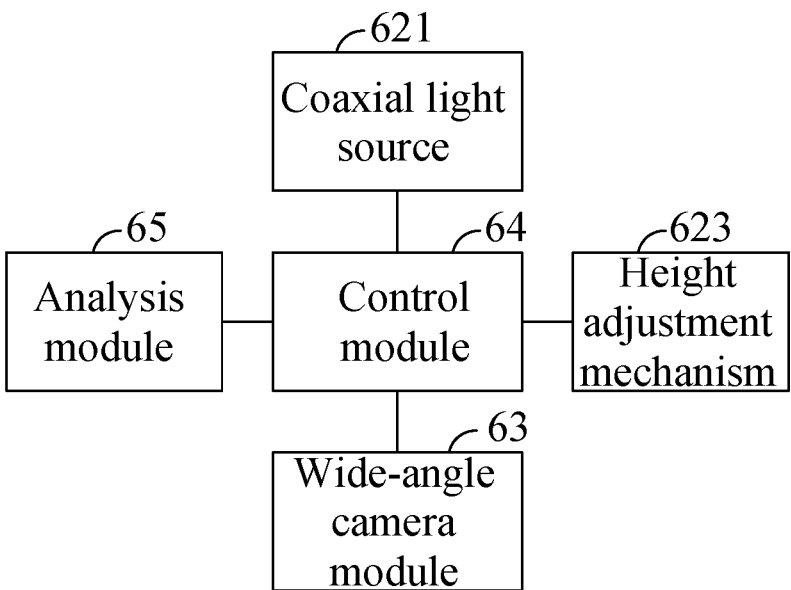

FIG. 9 is a block diagram of an inspection device for a sub-element of a reticle pod according to an embodiment of the present application.

DETAILED DESCRIPTION OF THE INVENTION

To fully understand the present application, the present application is described in detail by way specific embodiments with the accompanying drawings below. A person skilled in the art would be able to understand the objects, features and effects of the present application on the basis of the application of the present application. It should be noted that, the present application may be implemented or applied by other specific embodiments, and changes and modifications may also be made on the basis of different perspectives and applications to various details in the description without departing from the spirit of the present application. Technical contents associated with the present application are described in detail below, and it should be noted that the application is not to be construed as limitations to the scope of claims of the present application. Associated details are as given in the description below.

Figure 1A:
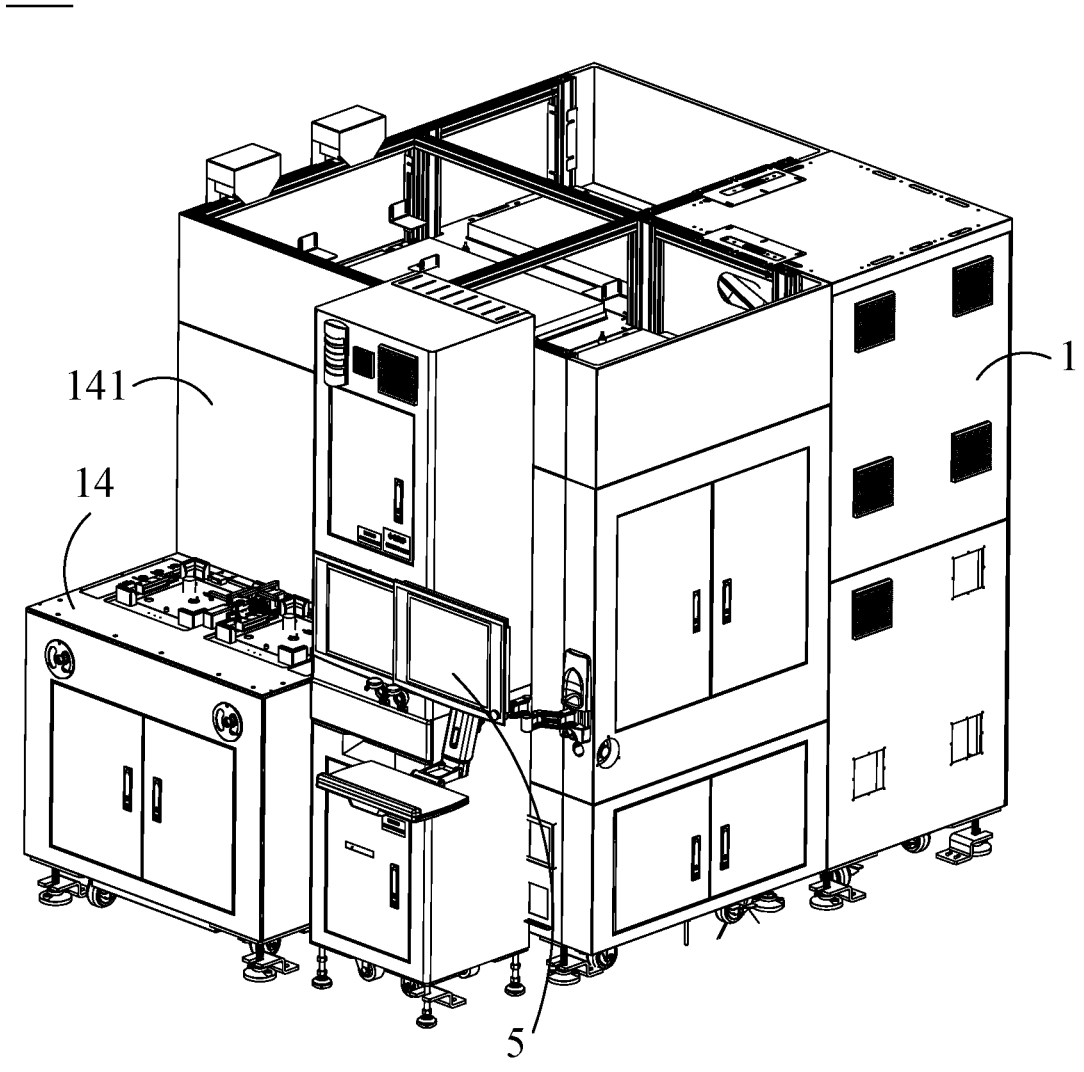
FIG. 1A is a schematic diagram of an appearance of a high-speed surface inspection system for a reticle pod according to a first embodiment of the present application.
Figure 1B:
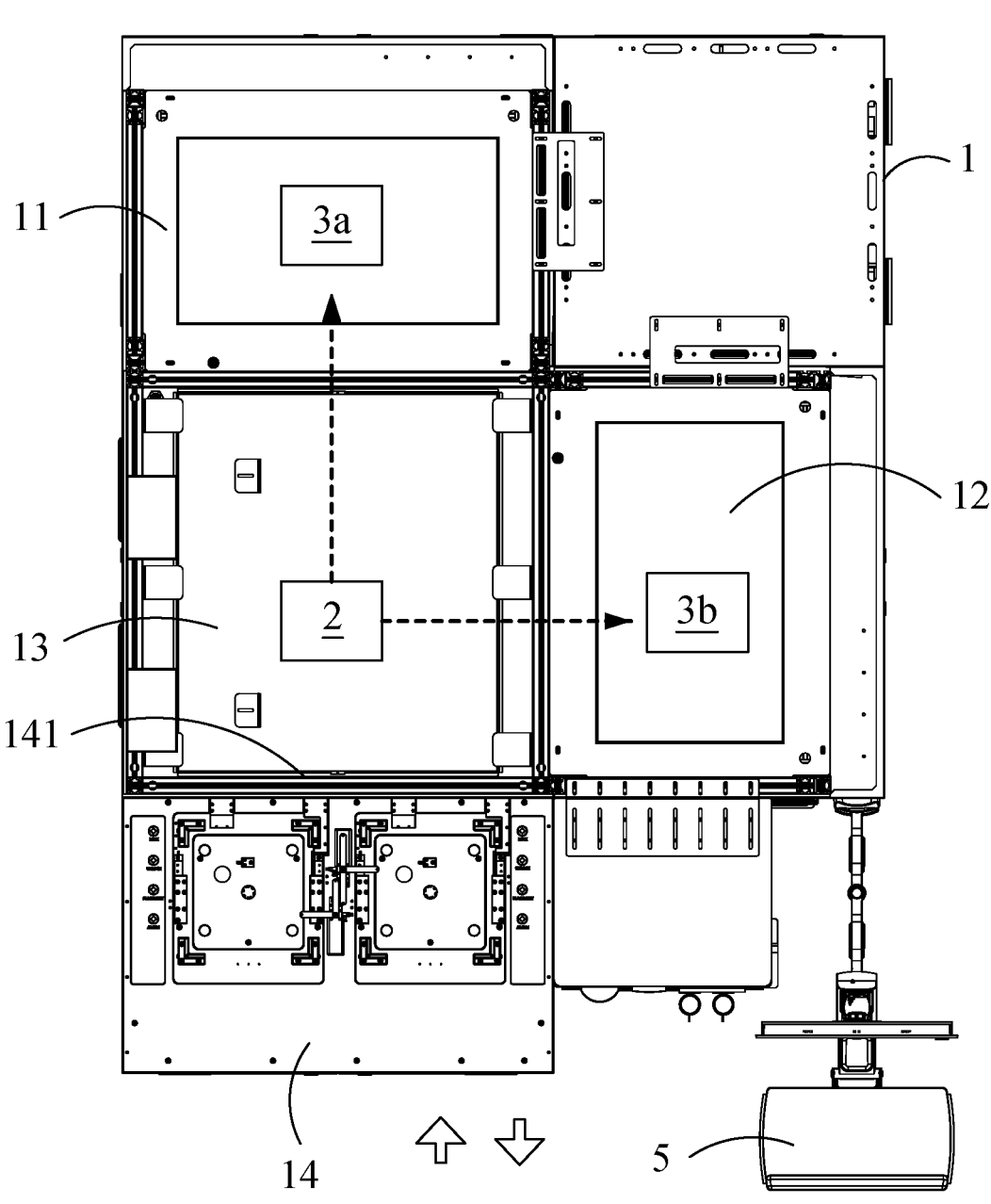
FIG. 1B is a top schematic diagram of a high-speed surface inspection system for a reticle pod according to the first embodiment of the present application.

As shown in FIG. 1A, FIG. 1B and FIG. 2A, a high-speed surface inspection system 100 for a reticle pod according to a first embodiment of the present application includes a cabinet 1, a clamping module 2, a first inspection device 3a, a second inspection device 3b, and a travel stroke controller 4.

The cabinet 1 may be a clean (high level of cleanliness) and sealed dedicated cabinet for a clean room to prevent external particles from contaminating the internal space. Referring to FIG. 1B, the internal space of the cabinet 1 is divided into an automated device area 13, a first inspection area 11, and a second inspection area 12. The first inspection area 11 and the second inspection area 12 are individually adjacent to the automated device area 13.

The clamping module 2 are both automated devices such as mechanical arms, and are disposed in the automated device area 13. The clamping module 2 can perform operations such as clamping, turning, and moving for transportation.

The first inspection device 3a and the second inspection device 3b are respectively disposed in the first inspection area 11 and the second inspection area 12. In this embodiment, the first inspection device 3a and the second inspection device 3b are devices that perform inspection by optical means; however, the present application is not limited to the above example. In other embodiments, the first inspection device 3a and the second inspection device 3b may also be devices that practice other principles (for example, electricity and mechanics) or a combination thereof. Any inspection device for inspecting a surface of a reticle pod may be used as the first inspection device 3a and the second inspection device 3b of the present application.

Referring to FIG. 2A, the travel stroke controller 4 is signally connected to the clamping module 2, the first inspection device 3a, and the second inspection device 3b. The travel stroke controller 4 is, for example, a control chip or a control circuit, and is primarily used to control travel strokes of the operations of the clamping module 2 and activations of the first inspection device 3a and the second inspection device 3b. For example, the travel stroke controller 4 can control the clamping module 2 to operate in collaboration so as to separate or combine a reticle pod (not shown), in a way that the clamping module 2 is controlled to reciprocate between the automated device area 13 and the first inspection area 11 so as to transport a first portion (for example, an upper cover) of the reticle pod, and the clamping module 2 is controlled to reciprocate between the automated device area 13 and the second inspection area 12 so as to transport a second portion (for example, a lower cover) of the reticle pod.

Referring to FIG. 3A, how the high-speed surface inspection system 100 for a reticle pod of the present application is used to perform a high-speed surface inspection method for a reticle pod of the present application is described below.

As shown in FIG. 3A, first of all, in step S101, a reticle pod is clamped by the clamping module 2, and the reticle pod is divided into a first portion and a second portion. The first portion and the second portion are, for example, an upper cover and a lower cover, or a lower cover and an upper cover. If the high-speed surface inspection system 100 for a reticle pod is not additionally provided with a reticle pod load area, such reticle pod load area may be integrated into the automated device area 13, and this step S101 completes the dividing of the reticle pod in the automated device area 13.

Next, in step S102, the travel stroke controller 4 controls the clamping module 2, in a state of clamping the first portion of the reticle pod, to move from the automated device area 13 to the first inspection area 11. Once the clamping module 2 enters the first inspection area 11, the travel stroke controller 4 controls the first inspection device 3*a* to be activated so as to inspect the first portion.

Next, in step S103, when the first portion is inspected, the travel stroke controller 4 controls the clamping module 2 back to the automated device area 13, and the travel stroke controller 4 controls the clamping module 2, in a state of clamping the second portion of the reticle pod, to move from the automated device area 13 to the second inspection area 12. At this time, the travel stroke controller 4 controls the second inspection device 3*b* to be activated so as to inspect the second portion. In other words, after the reticle pod is divided into two portions, each part of the disassembled pod is entered into two inspection areas by clamping module 2 for separate inspections, so as to individually inspect surfaces of the upper cover of the reticle pod and surfaces of the lower cover of the reticle pod within a same period of time, thereby accelerating the inspection on the individual portions and the individual surfaces of the reticle pod.

Next, in step S104, once the inspection is complete, the travel stroke controller 4 controls the clamping module 2, in a state of clamping the second portion of the reticle pod, to return to the automated device area 13 from the second inspection area 12, and controls the clamping module 2, in a state of clamping the first portion of the reticle pod, to return to the automated device area 13 from the first inspection area 11 for combining the first portion and the second portion into the complete reticle pod. The combining may be aligning and covering the upper cover and the lower cover of the reticle pod with each other, or may be performed by other mechanism means to recombine the two portions of the reticle pod into one body.

When this reticle pod is moved away and a next reticle pod is placed in, the travel stroke controller 4 can control the clamping module 2, the first inspection device 3*a*, and the second inspection device 3*b* to continue repeating the above process. Thus, the high-speed surface inspection system 100 for a reticle pod of the present application is capable of constantly inspecting the cleanliness and/or for other defects of the surfaces of individual reticle pods at a high speed. Compared to other prior art, the present application significantly reduces inspection time and ensures that a reticle pod is kept clean and free from damage during an inspection process.

Figure 1C:
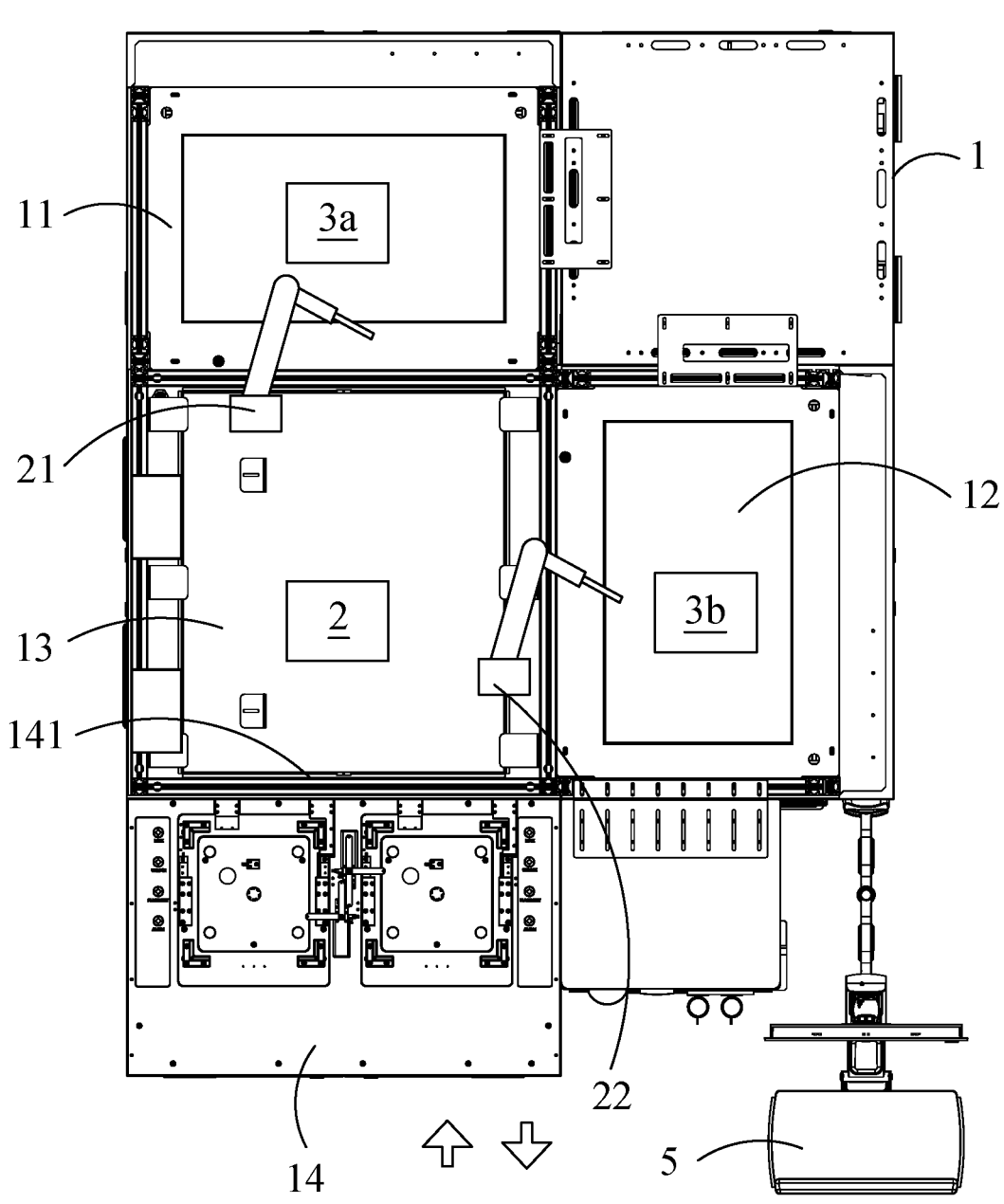
FIG. 1C is a top schematic diagram of a high-speed surface inspection system for a reticle pod according to a second embodiment of the present application.

In addition, a second embodiment of the present application is provided. A high-speed surface inspection system 200 for a reticle pod according to the second embodiment, as shown in FIG. 1C and FIG. 2C, the clamping module 2 further includes a first clamping arm 21 and a second clamping arm 22 to improve transport and inspection efficiency. The first clamping arm 21 and the second clamping arm 22 are both automated devices such as mechanical arms, and are disposed in the automated device area 13. The first clamping arm 21 and the second clamping arm 22 can perform operations such as clamping, turning, and moving for transportation. The first clamping arm 21 and the second clamping arm 22 are not defined to be a specific structure, and may be, for example, six-axis mechanism arms capable of operating with high sensitivity and precision in six axes. The first clamping arm 21 and the second clamping arm 22 are shown as two separate mechanical arms in the schematic diagrams, however, the first clamping arm 21 and the second clamping arm 22 can also be integrated into one mechanical arm.

As shown in FIG. 3B, first of all, in step S301, a reticle pod is clamped by the first clamping arm 21 and the second clamping arm 22, and the reticle pod is divided into a first portion and a second portion. The first portion and the second portion are, for example, an upper cover and a lower cover, or a lower cover and an upper cover. This part of operation is performed by the travel stroke controller 4 to control the first clamping arm 21 and the second clamping arm 22 to operate in collaboration. Moreover, if the high-speed surface inspection system 200 for a reticle pod is not additionally provided with a reticle pod load area, such reticle pod load area may be integrated into the automated device area 13, and this step S301 completes the dividing of the reticle pod in the automated device area 13.

Next, in step S302, the travel stroke controller 4 controls the first clamping arm 21, in a state of clamping the first portion of the reticle pod, to move from the automated device area 13 to the first inspection area 11, and at the same time the travel stroke controller 4 controls the clamping arm 22, in a state of clamping the second portion of the reticle pod, to move from the automated device area 13 to the second inspection area 12. Once the first clamping arm 21 enters the first inspection area 11, the travel stroke controller 4 controls the first inspection device 3*a* to be activated so as to inspect the first portion. On the other hand, once the second clamping arm 22 enters the second inspection area 12, the travel stroke controller 4 controls the second inspection device 3*b* to be activated so as to inspect the second portion. In other words, after the reticle pod is divided into two portions, the first clamping arm 21 and the second clamping arm 22 each hold the respective portions and enter the two inspection areas for separate inspections, so as to individually inspect surfaces of the upper cover of the reticle pod and surfaces of the lower cover of the reticle pod within a same period of time, thereby accelerating the inspection on the individual portions and the individual surfaces of the reticle pod.

Next, in step S303, once the inspection is complete, the travel stroke controller 4 controls the first clamping arm 21, in a state of clamping the first portion of the reticle pod, to return to the automated device area 13 from the first inspection area 11, and controls the second clamping arm 22, in a state of clamping the second portion of the reticle pod, to return to the automated device area 13 from the second inspection area 12, and controls the first clamping area 21 and the second clamping arm 22 to combine the reticle pod. The combining may be aligning and covering the upper cover and the lower cover of the reticle pod with each other, or may be performed by other mechanism means to recombine the two portions of the reticle pod into one body.

When this reticle pod is moved away and a next reticle pod is placed in, the travel stroke controller 4 can control the first clamping arm 21, the second clamping arm 22, the first inspection device 3*a*, and the second inspection device 3*b* to continue repeating the above process. Thus, the high-speed surface inspection system 200 for a reticle pod of the present application is capable of constantly inspecting the cleanliness and/or for other defects of the surfaces of individual reticle pods at a high speed. Compared to other prior art, the present application significantly reduces inspection time and ensures that a reticle pod is kept clean and free from damage during an inspection process.

In addition, in an embodiment, as shown in FIG. 1C, a reticle pod load area 14 is further provided on an outer side of the cabinet 1 to load a reticle pod. The cabinet 1 is provided with a load door 141, which separates the automated device area 13 and the reticle pod load area 14. The first clamping arm 21 and the second clamping arm 22 may collaboratively clamp and divide/combine the reticle pod in the reticle pod load area 14, or clamp the reticle pod into the automated device area 13 and then divide/combine the reticle pod. In this example, the reticle pod load area 14 further serves as an unload area (reticle pods enter and exit simultaneously). In this case, the travel stroke controller 4 controls the first clamping arm 21 to reciprocate between the reticle pod load area 14 and the first inspection area 11 (by passing through the automated device area 13) so as to transport the first portion of the reticle pod, and controls the second clamping arm 22 to reciprocate between the reticle pod load area 14 and the second inspection area 12 (by passing through the automated device area 13) so as to transport the second portion of the reticle pod.

Figure 1D:
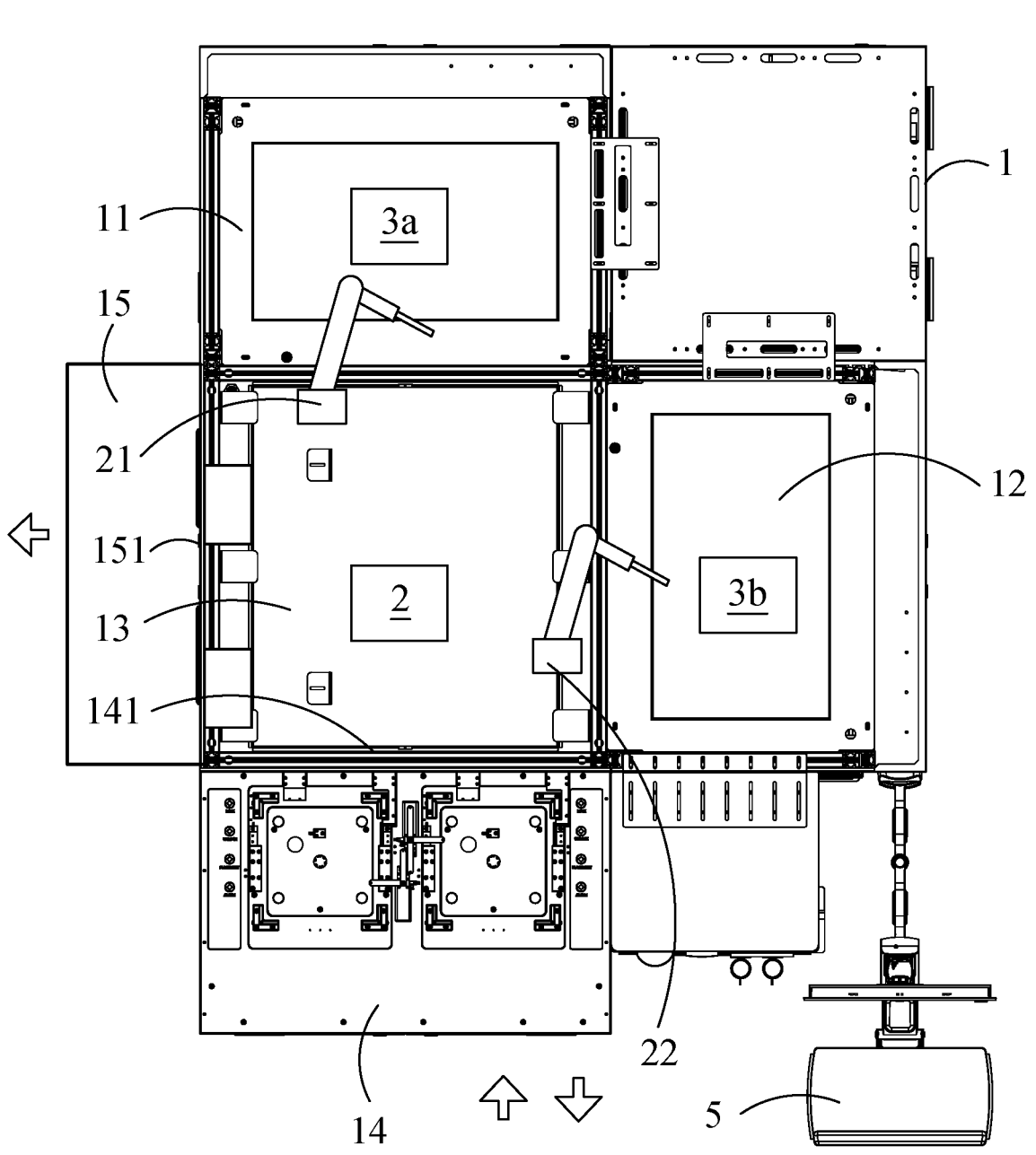
FIG. 1D is a top schematic diagram of a high-speed surface inspection system for a reticle pod according to a third embodiment of the present application.

In addition, a third embodiment of the present application is provided. A high-speed surface inspection system 300 for a reticle pod according to the third embodiment, as shown in FIG. 1D, a reticle pod unload area 15 (different form the original reticle pod load area 14) is further provided on the outer side of the cabinet 1. The cabinet 1 is provided with an unload door 151, which separates the automated device area 13 and the reticle pod unload area 15. The first clamping arm 21 and the second clamping arm 22 may collaboratively clamp and divide the reticle pod in the reticle pod load area 14, or clamp the reticle pod into the automated device area 13 and then divide the reticle pod; then combine the reticle pod in the automated device area 13 or combine the reticle pod in the reticle pod unload area 15 (reticle pods are loaded and unloaded at different positions). In the above process, the travel stroke controller 4 controls the first clamping arm 21 to reciprocate among the reticle pod load area 14, the first inspection area 11, and the reticle unload area 15 (by passing through the automated device area 13 midway) so as to transport the first portion of the reticle pod, and the travel stroke controller 4 also controls the second clamping arm 22 to reciprocate among the reticle pod load area 14, the second inspection area 12, and the reticle unload area 15 (by passing through the automated device area 13 midway) so as to transport the second portion of the reticle pod. Thus, the loading and unloading of the reticle pod may form a pipeline.

In addition, as shown in FIG. 1A to FIG. 1B, the high-speed surface inspection system 100 for a reticle pod may further include a human-machine interface 5 to manually control the high-speed surface inspection system 100 for a reticle pod. The human-machine interface 5 is signally connected to the travel stroke controller 4, and is, for example, a device such as a keyboard, a press button or a touch screen.

In addition, the high-speed surface inspection system 100 for a reticle pod may further include a cleaning device signally connected to the travel stroke controller 4. When a certain portion of the reticle pod is determined as unqualified (for example, having particles or defects), the travel stroke controller 4 controls the clamping module 2 to clamp the portion and move to the cleaning device for re-cleaning and re-inspection. The cleaning device is, for example, a wind blade or other devices capable of attracting and blowing particles, or may be a device that provides a cleaning fluid.

As shown in FIG. 2A, FIG. 2C and FIG. 4A to FIG. 4C, the detailed structure of each of the first inspection device 3*a* and the second inspection device 3*b* of the present application may be an optical inspection device 3 for a surface of a reticle pod. The optical inspection device 3 includes a carrier platform 31, a light source module 32, a camera module 33 and a control module 34.

The carrier platform 31 is used to carry a reticle pod or a portion (an upper cover or a lower cover) of a reticle pod, and has a carrier surface 311. The reticle pod or the portion of the reticle pod is carried on the carrier surface 311 for surface inspection.

The light source 32 includes a first light source 321 and a second light source 322. The first light source 321 irradiates the carrier surface 311 in a first direction (as shown in FIG. 4B), and the second light source 322 irradiates the carrier surface 311 (as shown in FIG. 4C) in a second direction, wherein an angle of an included angle between the first direction and the carrier surface 311 is greater than an angle of an included angle between the second direction and the carrier surface 311, which preferably differs by 45 degrees or more.

A lens of the camera module 33 faces the carrier surface 311 to capture a surface image of the reticle pod or a portion of the reticle pod. The camera module 33 is, for example, a capturing device having a charge-coupled device (CCD), preferably high speed CCD, so as to capture a surface image of the reticle pod at a high speed.

The control module 34 is signally connected to the camera module 33, the first light source 321, the second light source 322, and the travel stroke controller 34. When the optical inspection device 3 for a surface of a reticle pod serves as the first inspection device 3*a* and/or the second inspection device 3*b* of the high-speed surface inspection system 100 for a reticle pod, the control module 34 is further connected to the travel stroke controller 4. When the travel stroke controller 4 instructs the optical inspection device for a surface of a reticle pod to activate for inspection (or in another example, the control module 34 receives an external instruction to activate for inspection), the control module 34 controls one of the first light source 321 and the second light source 322 to be turned on and the other to be turned off, and controls the camera module 33 to perform capturing, so as to obtain an image under the first light source 321 and an image of the second light source 322, respectively. The control module 34 is, for example, a control chip or a control circuit.

When an angle between the light sources is quite large, it can be determined in combination whether images at the same position truly contain the existence of particles or defects, so as to prevent any misjudgment. In this embodiment, the first light source 321 is a coaxial light source (FIG. 4A shows an external coaxial light source), and the second light source 322 is a side light source, and with the coaxial light source and the lateral side light source being perpendicular to the carrier surface 311, the carrier surface 311 is irradiated so as to obtain images under the two types of light sources. The side light source may be a ring side light mechanism that emits side light in a direction encircling the lens; however, the present application is not limited to the above example.

Next, how the optical inspection device 3 for a surface of a reticle pod of the present application is used to perform an optical inspection method for a surface of a reticle pod of the present application is described below.

As shown in FIG. 7, first of all, in step S201, the control module 34 controls the first light source 321 to irradiate a component of a reticle pod in a first direction (referring to FIG. 4B), and the second light source 322 needs to be turned off at this point. The component of the reticle pod may be an entire outer pod or inner pod of the reticle pod, or a partial component of an outer pod or inner pod of the reticle pod, for example, an upper cover or a lower cover. The component of the reticle pod is disposed on the carrier surface 311. Since a surface under inspection of the component of the reticle pod is parallel to the carrier surface 311, the component of the reticle pod is omitted from the drawing.

Next, referring to FIG. 6, in step S202, the control module 34 controls the camera module 33 to capture a partial surface of a component P of the reticle pod to obtain a first image P1.

Next, referring to FIG. 4C, in step S203, the control module 34 controls the second light source 322 to irradiate the component of the reticle pod in a second direction (the first light source 321 needs to be turned off at this point), wherein an angle of an included angle between the first direction and the carrier surface 311 is greater than an angle of an included angle between the second direction and the carrier surface 311; that is, the second light source 322 is a side light source relative to the first light source 321 that is a front light source.

Next, referring to FIG. 6, in step S204, the control module 34 controls the camera module 33 to capture the same partial surface of the component P of the reticle pod to obtain a first image P2.

Lastly, in step S205, it is determined according to the first image P1 and the second image P2 whether a defect exists. The control module 34 may further include an analysis sub-module which is built-in with a database to analyze image data captured.

It may be difficult for the camera module 33 to capture a clear and complete global image of the component P of the reticle pod by capturing once only, and individual surfaces of the component P of the reticle pod may have different height. Thus, in a preferred embodiment, the component P of the reticle pod is captured multiple times to step-by-step obtain an entire image of the component P of the reticle pod. As shown in FIG. 6, the camera module may move in the X axis, the Y axis, or other directions so as to step-by-step capture the entire component P of the reticle pod. Thus, the optical inspection device 3 for a surface of a reticle pod of the present application may further include a power module 35 signally connected to the control module 34. The power module 35 is, for example, a conventional mechanism that can be controlled by electric signals and provide power for reciprocating movement, such as a servo motor, a step motor, or a cylinder. In one example, the power module 35 is power connected to the carrier platform 31, and the control module 34 controls the carrier platform 31 to move relative to the camera module 33. In other examples, alternatively, the power module 35 may also be power connected to the camera module 33, and the control module 34 controls the camera module 33 to move relative to the carrier platform 31. Both of the methods above can achieve relative horizontal movements of the camera module 33 and the carrier platform 31 on the carrier surface 311. The first light source 321 and the second light source 322 are usually integrated with the camera module 33 in a same mechanism. Thus, the first light source 321 and the second light source 322 also move when the camera module 33 moves so as to provide stable light sources.

In addition, the determination of step S205 above may perform analysis only after the entire component P of the reticle pod is fully captured, or the analysis may be performed immediately after the first image P1 and the second image P2 are obtained from respectively capturing the partial surfaces.

Moreover, due to the extremely minute sizes of particles and defects on the component P of the reticle pod, possibly in a scale of microns and frequently less than a movement error of the power module 35, it may be difficult for the camera module 33 to return to the same position and capture the same particles or defects after having been moved. Thus, in a preferred capturing approach, the camera module 33 individually captures the first image P1 and the second image P2 when residing at the same position, and then moves to a next position. The issue encountered by the above is how to quickly switch on/off of the first light source 321 and the second light source 322 so as to accelerate the capturing process.

As shown in FIG. 2B, in an embodiment of the present application, the optical inspection device 3 for a surface of a reticle pod further includes a switch 36. The switch 36 is signally connected to the control module 34, the first light source 321, and the second light source 322, so as to control the rapid on-off of the first light source 321 and the second light source 322. The switch 36 can have various forms. In this embodiment, the switch 36 includes a first relay 361 and a second relay 362, wherein the first relay 361 is disposed on a signal path between the control module 34 and the first light source 321, and the second relay 362 is disposed on a signal path between the control module 34 and the second light source 322. A relay is also referred to as an electric relay, and may serve as an automatic switch. With the first relay 361 and the second relay 362, on and off of the first light source 321 and the second light source 322 can be quickly switched in turn, thereby accelerating the processes of image capturing and inspection. The relay is a low-cost, safe, fast and reliable implementation, but the switch 36 of the present invention is not limited thereto. In other embodiments, the switch 36 is, for example, a thyristor, a switching diode, a switching triode, an electronic bidirectional switching integrated circuit, a photocoupler, etc., and may also be a modulator to control the rapid turn on and off of the first light source 321 and the second light source 322 with the modulation signal. In other examples, the switching can also be achieved by using a shutter or mechanically controlling the blocking of the optical path. For example, the first light source 321 and the second light source 322 are from the same main light source but travel through different light paths respectively, and a rotatable mirror is arranged at the branch of the light paths to guide the light to one of the light paths and let the other light path lose light, so as to achieve for rapid switching purposes.

In addition, as shown in FIG. 5, an optical inspection device 3' for a surface of a reticle pod, compared to the optical inspection device 3 for a surface of a reticle pod, alternatively uses an internal coaxial light source as a first light source 321'. The external coaxial light source or the internal coaxial light source may both serve as the first light source of the present application. However, the internal coaxial light source, featuring advantages of having a small volume, low power consumption, ultra-high brightness, and a low amount of heat emission, is usually integrated with the camera module 33 into an integral mechanism.

Although each of the first inspection device 3a and the second inspection device 3b of the present application may be the optical inspection device 3 for a surface of a reticle pod, it does not mean that the optical inspection device 3 for a surface of a reticle pod is necessarily to be bound and implemented in the high-speed surface inspection system 100 for a reticle pod. The optical inspection device 3 for a surface of a reticle pod may be implemented as an independent inspection device, or be combined with another type of device into another system.

Referring to FIG. 8A to FIG. 9, the present application further provides an inspection device 6 for a sub-element of a reticle pod. At least one of the first inspection device 3a and the second inspection device 3b in the high-speed surface inspection system 100 for a reticle pod of the present application may be replaced by the inspection device 6 for a sub-element of a reticle pod. However, the inspection device 6 for a sub-element of a reticle pod may also be implemented independently, and is used to inspect a sub-element (for example, a plastic member, a metal member or a glass window attached on a body of a reticle pod) on a reticle pod, or may be combined with another type of device into another system. The inspection device 6 for a sub-element of a reticle pod includes a carrier platform 61, a light source module 62, a camera module 63 and a control module 64.

The carrier platform 61 is used to carry a reticle pod or a portion (an upper cover or a lower cover) of a reticle pod, and has a carrier surface 611. The reticle pod or the portion of the reticle pod is carried on the carrier surface 611 for surface inspection.

The light source 62 includes a coaxial light source 621 and a height adjustment mechanism 623, wherein the height adjustment mechanism 623 is connected to at least one of the coaxial light source 621 and the carrier platform 61. The coaxial light source 621 may be an external coaxial light source or an internal coaxial light source, and an external coaxial light source is represented in FIG. 8A; however, an internal coaxial light source similar to that in FIG. 5 may also be used in substitution. The height adjustment mechanism 623 is, for example, a conventional mechanism that can be controlled by electric signals and provide power for reciprocating movement in a height direction, such as a servo motor, a step motor, or a cylinder. In FIG. 8A, the height adjustment mechanism 623 is connected to the coaxial light source 621 as an example; however, alternatively, the height adjustment mechanism 623 may be connected to the carrier platform 61, or be connected to both the coaxial light source 621 and the carrier platform 61.

The camera module 63 is connected to the coaxial light source 621 and has a lens facing the carrier platform 61. The camera module 63 is, for example, a conventional non-telecentric camera module, and is capable of receiving incident light from multiple angles.

The control module 64 is signally connected to the camera module 63 and the height adjustment mechanism 623. When the inspection device 6 for a sub-element of a reticle pod serves as one of the first inspection device 3a and the second inspection device 3b of the high-speed surface inspection system 100 for a reticle pod, the control module 64 is further connected to the travel stroke controller 4. The control module 64 is, for example, a control chip or a control circuit. The control module 64 controls the height adjustment mechanism 623 to adjust a relative distance between the coaxial light source 621 and the carrier platform 61, allowing the camera module 63 (in conjunction with the coaxial light source 621) to receive different amounts of incident light so as to generate different effects of sharpness or blur.

As shown in FIG. 8B, when the relative distance between the coaxial light source 621 and the carrier platform 61 is longer, an image captured appears sharper. Conversely, as shown in FIG. 8C, when the relative distance between the coaxial light source 621 and the carrier platform 61 is shorter, the camera module 63 the image captured by the camera module 63 appears more blurry. To determine whether a surface of a reticle pod contains particles or defects, the surface on the pod can be photographed in a relatively sharp way (a longer relative distance between the coaxial light source 621 and the carrier platform 61); and then photograph the sub-elements on the pod in a relatively blurred way (a shorter relative distance between the coaxial light source 621 and the carrier platform 61). Because a sub-element (mostly made of plastic or less scratch-resistant metal or glass) on a reticle pod is more prone to wear compared to the body and such wear is less hazardous to the reticle pod, the sub-element is more tolerable to defects such as scratches compared to the body of the reticle pod. If the same optical inspection standard is used for the sub-element and the body of the reticle pod, there are hardly any sub-elements that can pass the inspection.

Thus, while the camera module 63 captures an image of the sub-element, the control module 64 may control the height adjustment mechanism 623 to adjust the relative distance between the coaxial light source 621 and the carrier platform 61 to decrease the relative distance, thereby capturing a more blurry image. Conversely, when the camera module 63 captures the body of the reticle pod, the control module 64 may control the height adjustment mechanism 623 to adjust the relative distance between the coaxial light source 621 and the carrier platform 61 to increase the relative distance, thereby capturing a shaper and clearer image, so as to maintain an optical inspection standard for the body of the reticle pod.

In conclusion, the inspection device 6 for a sub-element of a reticle pod of the present application is capable of at the same time performing optical inspection for different positions on the reticle pod by different levels of clarity, while inspecting the body of the reticle pod and the sub-element thereon.

In addition, in this embodiment, the light source module 62 further includes a side light source 622, and an angle of an included angle between an irradiation direction of the coaxial light source 621 and the carrier surface 611 is greater than an angle of an included angle between an irradiation direction of the side light source 622 and the carrier surface 611. Configuration details and optical inspection principles of the side light source 622 are the same as those given in the description associated with the second light source 322 of the optical inspection device 3 for a surface of a reticle pod above and are thus omitted herein.

In addition, in this embodiment, the inspection device 6 for a sub-element of a reticle pod further includes a switch, signally connected to the control module 64, the coaxial light source 621, and the side light source 622. The switch can include a first relay and a second relay. The first relay is disposed on a signal path between the control module 64 and the coaxial light source 621, and the second relay is disposed on a signal path between the control module 64 and the side light source 622. The principles and effects of the first relay and the second relay of this embodiment are the same as those of the first relay 361 and the second relay 362 of the optical inspection device 6 for a surface of a reticle pod described above, and are thus omitted herein. The implementation manner of the relay is not limited in the switch of the inspection device 6 for a sub-element of a reticle pod, but can also be the various possible implementation manners mentioned above.

In addition, as shown in FIG. 9, in this embodiment, the inspection device 6 for a sub-element of a reticle pod further includes an analysis module 65 signally connected to the control module 64. The analysis module 65 analyzes the defects of a sub-element of a reticle pod shown in the images received by the control module 64. The analysis module 65 is built-in with a database to analyze whether a captured image contains defects.

The present invention is described by way of the embodiments above. A person skilled in the art should understand that, these embodiments are merely for describing the present invention are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. An optical inspection device for a surface of a reticle pod, comprising:

a carrier platform having a carrier surface;

a light source module including a first light source and a second light source, wherein the first light source irradiates the carrier surface in a first direction, the second light source irradiates the carrier surface in a second direction, an angle of an included angle between the first direction and the carrier surface is greater than an angle of an included angle between the second direction and the carrier surface;

a camera module, wherein a lens of the camera module faces the carrier surface;

a power module signally connected to the control module;

a control module signally connected to the camera module, the first light source, and the second light source; and a switch including a first relay and a second relay, wherein the first relay is disposed on a signal path between the control module and the first light source, and the second relay is disposed on a signal path between the control module and the second light source, wherein the control module switches the first light source and the second light source on and off in turn through the first relay and the second relay, and wherein the control module controls the camera module to capture a first image and a second image individually through switching the first relay and the second relay when the camera module resides at the same position, and then the control module controls the power module to move the camera module relative to the carrier platform to a next position and controls the camera module to capture images individually at the next position through switching the first relay and the second relay.

2. The optical inspection device for a surface of a reticle pod according to claim 1, wherein the power module is power connected to the carrier platform, and the control module controls the carrier platform to move relative to the camera module.

3. The optical inspection device for a surface of a reticle pod according to claim 1, wherein the power module is power connected to the camera module, and the control module controls the camera module to move relative to the carrier platform.

4. An optical inspection method for a surface of a reticle pod, comprising the steps of:

switching a first relay to cause a first light source to irradiate a component of a reticle pod in a first direction and turning off a second light source;

capturing a partial surface of the component of the reticle pod by a camera module to obtain a first image;

switching a second relay to cause the second light source to irradiate the component of the reticle pod in a second direction and turning off the first light source, wherein an angle of an included angle between the first direction and a carrier surface is greater than an angle of an included angle between the second direction and the carrier surface;

capturing the partial surface of the component of the reticle pod to obtain a second image;

determining whether a defect exists according to the first image and the second image;

moving the camera module relative to the component of the reticle pod to a next position; and switching the first relay and the second relay in turn at the next position to obtain images of another partial surface different from the partial surface.

* * * * *